(12) United States Patent
Ng et al.

(10) Patent No.: US 10,558,906 B2
(45) Date of Patent: Feb. 11, 2020

(54) METHOD FOR EMBEDDING INTEGRATED CIRCUIT FLIP CHIP

(71) Applicants: SMARTFLEX TECHNOLOGY PTE LTD, Singapore (SG); Eng Seng Ng, Singapore (SG)

(72) Inventors: Eng Seng Ng, Singapore (SG); Sze Yong Pang, Singapore (SG)

(73) Assignees: SMARTFLEX TECHNOLOGY PTE LTD, Singapore (SG); Eng Seng Ng, Singapore (SG)

( * ) Notice: Subject to any disclaimer, the term of this patent is extended or adjusted under 35 U.S.C. 154(b) by 2 days.

(21) Appl. No.: 15/767,043

(22) PCT Filed: Nov. 22, 2016

(86) PCT No.: PCT/SG2016/050574
§ 371 (c)(1),
(2) Date: Apr. 9, 2018

(87) PCT Pub. No.: WO2017/095329
PCT Pub. Date: Jun. 8, 2017

(65) Prior Publication Data
US 2018/0300597 A1     Oct. 18, 2018

Related U.S. Application Data

(60) Provisional application No. 62/263,105, filed on Dec. 4, 2015.

(51) Int. Cl.
*H01L 21/00* (2006.01)
*G06K 19/077* (2006.01)
(Continued)

(52) U.S. Cl.
CPC . *G06K 19/07745* (2013.01); *G06K 19/07722* (2013.01); *G06K 19/07743* (2013.01);
(Continued)

(58) Field of Classification Search
CPC ............... H01L 25/0657; H01L 25/50; G06K 19/07722; G06K 19/07743; G06K 19/07745
(Continued)

(56) References Cited

U.S. PATENT DOCUMENTS

2003/0024995 A1\*  2/2003  Conner ............... G06K 19/044
235/492
2014/0042230 A1\*  2/2014  Pueschner ............... H01Q 1/38
235/492

FOREIGN PATENT DOCUMENTS

EP       2750082       7/2014
FR       2980015       3/2013

\* cited by examiner

*Primary Examiner* — Brook Kebede
(74) *Attorney, Agent, or Firm* — Cuenot, Forsythe & Kim, LLC; Stanley A. Kim

(57) ABSTRACT

Embodiments of the invention relate to processes for fabricating a smart device (200), e.g. smart card, and configurations for smart card devices with greater reliability and lifespan, and improved finish. In the smart card device comprising of laminated substrate layers (220, 240) interposing a flexible film (230) having conductor pattern thereon, at least one flip chip (250) for operating the smart card device is embedded in a first substrate (220) such that the first substrate provides an encapsulation to the at least one flip chip, wherein the at least one flip chip (250) is arranged at a position in a first vertical plane; and a contact pad (260), for providing electrical connection when the smart card device is inserted into a smart card reader, is arranged at a position in a second vertical plane, wherein the first vertical plane is non-overlapping with the second vertical plane. The contact pad (260) is projected through a (Continued)

cavity in a second substrate to form a continuous even plane from an outer surface of the laminated substrate layers to the contact pad (260).

22 Claims, 7 Drawing Sheets

(51) Int. Cl.
*H01L 25/065* (2006.01)
*H01L 25/00* (2006.01)
(52) U.S. Cl.
CPC .......... *H01L 25/0657* (2013.01); *H01L 25/50* (2013.01); *H01L 2225/06513* (2013.01)
(58) Field of Classification Search
USPC .......................................................... 438/108
See application file for complete search history.

METHOD FOR EMBEDDING INTEGRATED CIRCUIT FLIP CHIP

CROSS REFERENCE TO RELATED APPLICATIONS

The present application is the U.S. national phase under 35 U.S.C. 371 of international patent application number PCT/SG2016/050574 filed on Nov. 22, 2016, which designated the U.S., and which claimed priority to U.S. provisional patent application No. 62/263,105 filed on Dec. 4, 2015, which are incorporated herein by reference.

FIELD OF INVENTION

The invention relates to manufacture of smart card devices with improved lifespan, reliability and aesthetics, and methods of manufacturing that reduce production steps and costs.

BACKGROUND

An integrated circuit (IC) module, of smart-type, that can be either a secure microcontroller or equivalent intelligence with internal memory or a memory chip alone, is normally packaged or embedded in a carrier (e.g. card). The resulting smart card device can be capable of connecting to a reader by direct physical contact, i.e. using contact-type interface defined by ISO (International Organization for Standardization) 7816, or by a remote contactless radio frequency interface, i.e. using contactless-type defined by ISO 14443, or both, i.e. using dual interface. With the embedded microcontroller, smart card devices are capable of storing large amounts of data, performing on-card functions (e.g. encryption, mutual authentication) and interacting intelligently with a smart card reader for various applications (e.g. banking, payment, telecommunications). The smart card devices may be packaged into various form factors (e.g. plastic cards, key fobs, watches, subscriber identification modules used in GSM mobile phones, USB-based tokens, the Secure Digital (SD), mini/micro SD, MMC, VQFN8, SSOP20, TSSOP20, MemorySticks cards, etc).

Generally, a method for fabricating a dual interface smart card device includes:
1(a) assembling IC chips with wire bonding connections and encapsulation onto a flexible substrate with metallic contact pads, wherein at least one IC chip and two antenna contact pads are mounted on the underside of a metallic contact pad to produce an IC module (FIG. 1A shows multiple IC modules 110, having contact pad layouts according to ISO 7816, being assembled on a flexible substrate);
1(b) laminating a few substrate layers, which comprise an antenna coil inlay 130 interposed between two substrates 120, 140 of equal thickness, to produce a carrier core;
1(c) milling the laminated carrier core to provide a plurality of first cavities wherein each first cavity is to receive an IC module;
1(d) at each first cavity, further milling the laminating carrier a plurality of second cavities, which are smaller than the first cavity, to expose parts of the antenna wire coil;
1(e) joining the exposed parts of the antenna wire coil to the two antenna contact pads provided on the underside of the contact pad;
1(f) disposing an IC module into each first cavity such that a hot-melt tape on the underside of the IC module is applied to the laminated carrier core;
1(g) applying heat and pressure to the IC module to embed the IC module in the laminated carrier core.

In step 1(e) above, the antenna coil may be joined to the antenna contacts on the underside of the IC module by using traditional wire soldering, flexible bumps or insertion of conductive materials to solder onto the antenna contacts to form an electrical connection from the IC module to the antenna coil to allow performance of contact-type and contactless-type transactions.

Generally, a method for fabricating a single interface, i.e. contact-type, smart card device includes:
2(a) assembling IC chips with wire bonding connections and encapsulation onto a flexible substrate with metallic contact pads, wherein at least one IC chip and two antenna contact pads are mounted on the underside of a metallic contact pad to produce an IC module (FIG. 1A shows multiple IC modules, having contact pad layouts according to ISO 7816, being assembled on a flexible substrate);
2(b) laminating a few substrate layers, which comprise two substrates of equal thickness, to produce a laminated carrier core;
2(c) milling the laminated carrier core to provide a plurality of first cavities wherein each first cavity is to receive an IC module;
2(d) disposing an IC module into each first cavity such that a hot-melt tape on the underside of the IC module is applied to the laminated carrier core;
2(e) applying heat and pressure to the IC module to embed the IC module in the laminated carrier core.

FIG. 1B shows a cross-sectional view of a smart card device 100 having a wire-bonded encapsulated IC module 110 embedded in a laminated arrangement. In the IC module 110, the IC chip 150 is provided with encapsulation 152 and located directly underside of the contact pad 160.

SUMMARY

According to a first aspect of the invention, a method for fabricating a smart card device is provided. The method comprises:
providing a carrier core in which a flexible film having a plurality of conductor patterns is interposed between a first substrate and a second substrate, wherein each of the conductor patterns includes:
at least one flip chip arranged at a position in a first vertical plane,
at least one contact pad arranged at a position in a second vertical plane,
at least one conductor path electrically coupling the at least one contact pad to the at least one flip chip, wherein the first vertical plane is non-overlapping with the second vertical plane, wherein the step of providing a carrier core in which a flexible film having a plurality of conductor patterns is interposed between a first substrate and a second substrate further includes:
exposing the at least one contact pad through at least one cavity in the second substrate; and
laminating the carrier core to produce a laminated carrier core in which the at least one contact pad is projected through the at least one cavity in the second substrate to form a continuous even plane from an outer surface of the laminated carrier core to the at least one contact pad.

In one embodiment of the first aspect of the invention, the step of providing a carrier core in which a flexible film having a plurality of conductor patterns is interposed between a first substrate and a second substrate further includes:
- overlaying the flexible film on the first substrate to produce a temporary core;
- laminating the temporary core to produce a laminated temporary core; and
- overlaying a second substrate on the laminated temporary core to produce the carrier core.

In one embodiment of the first aspect of the invention, the step of providing a carrier core in which a flexible film having a plurality of conductor patterns is interposed between a first substrate and a second substrate further includes:
- abutting the at least one flip chip to the first substrate, and the step of laminating the carrier core to produce a laminated carrier core further includes:
- embedding the at least one flip chip into the first substrate.

In one embodiment of the first aspect of the invention, the first substrate is devoid of cavity.

In one embodiment of the first aspect of the invention, the first substrate is provided with at least one cavity having at least one dimensional measurement no greater than at least one dimensional measurement of the at least one flip chip, and wherein the at least one cavity of the first substrate is dimensioned to at least partially receive the at least one flip chip therein. The at least one dimensional measurement is selected from the group consisting of height, length and width.

In one embodiment of the first aspect of the invention, the step of providing a carrier core in which a flexible film having a plurality of conductor patterns is interposed between a first substrate and a second substrate further includes:
- abutting the at least one flip chip to the second substrate, and the step of laminating the carrier core to produce a laminated core further includes:
- embedding the at least one flip chip into the second substrate.

In one embodiment of the first aspect of the invention, the step of laminating the carrier core to produce a laminated core further includes:
- subjecting the carrier core to a hot cycle, wherein subjecting the carrier core to a hot cycle includes subjecting the carrier core to high temperature of at least 80° C. and applying pressure of at least $20 \times 10^5$ pascal (Pa) to the carrier core; and
- subjecting the carrier core to a cold cycle, wherein subjecting the carrier core to a cold cycle includes subjecting the core to low temperature of no more than 30° C. and applying pressure of at least $20 \times 10^5$ pascal (Pa) to the carrier core.

In one embodiment of the first aspect of the invention, the method further comprises: cutting the laminated carrier core into a plurality of individual sections.

In one embodiment of the first aspect of the invention, the step of cutting the laminated carrier core into a plurality of individual sections further includes:
- cutting each of the individual sections as ID-1 size according to ISO 7810, wherein each of the individual sections includes at most one of the at least one conductor pattern.

In one embodiment of the first aspect of the invention, the at least one contact pad is dimensioned according to ISO 7816.

In one embodiment of the first aspect of the invention, the first and the second vertical plane are non-overlapping with a third vertical plane, wherein an embossing area, which is designated on each of the individual section according to ISO 7811, is arranged at a position in the third vertical plane.

In one embodiment of the first aspect of the invention, a thickness of the first substrate is greater than a thickness of the second substrate.

In one embodiment of the first aspect of the invention, each of the conductor patterns further includes at least one antenna coil arranged on the flexible film and at a position in a fourth vertical plane, and wherein the fourth vertical plane is non-overlapping with the first and the second vertical plane, and wherein the at least one antenna coil is electrically coupled to the at least one flip chip.

According to a second aspect of the invention, a smart card device is provided. The smart card device comprises:
- a laminated carrier core comprising:
  - a first substrate;
  - a second substrate; and
  - a flexible film having a conductor pattern and interposed between the first and the second substrate, wherein the conductor pattern includes:
    - at least one flip chip embedded into the first or the second substrate, wherein the at least one flip chip is arranged at a position in a first vertical plane,
    - a contact pad arranged at a position in a second vertical plane,
    - at least one conductor path electrically coupling the contact pad to the at least one flip chip, wherein the first vertical plane is non-overlapping with the second vertical plane, and wherein the contact pad is projected through a cavity in the second substrate to form a continuous even plane from an outer surface of the laminated carrier core to the contact pad.

In one embodiment of the second aspect of the invention, the laminated carrier core is dimensioned as ID-1 size according to ISO 7810.

In one embodiment of the second aspect of the invention, the contact pad is dimensioned according to ISO 7816.

In one embodiment of the second aspect of the invention, an embossing area, which is designated on the laminated carrier core according to ISO 7811, is arranged in a position in a third vertical plane, wherein the third vertical plane is non-overlapping with the first and the second vertical plane.

In one embodiment of the second aspect of the invention, the embossing area is configured to be embossed with information being at least one selected from the group consisting of identification number, name and address.

In one embodiment of the second aspect of the invention, the at least one flip chip and the contact pad are arranged on opposite sides of the flexible film.

In one embodiment of the second aspect of the invention, the at least one flip chip and the contact pad are arranged on same side of the flexible film.

In one embodiment of the second aspect of the invention, the conductor pattern further includes at least one antenna coil electrically coupled to the at least one flip chip, wherein the at least one antenna coil is provided at a position in a fourth vertical plane, and wherein the fourth vertical plane is non-overlapping with the first and the second vertical plane.

BRIEF DESCRIPTION OF DRAWINGS

The invention will be described in detail with reference to the accompanying drawings, in which.

DETAILED DESCRIPTION

Figure 1A:
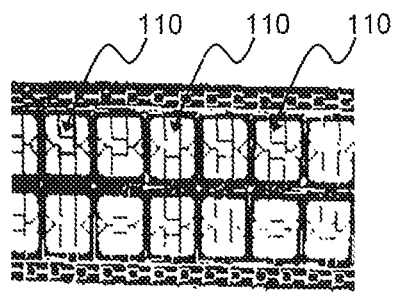
FIG. 1A shows an assembly of IC modules to be used in an existing method for fabrication of smart card device.

In the following description, numerous specific details are set forth in order to provide a thorough understanding of various illustrative embodiments of the invention. It will be understood, however, to one skilled in the art, that embodiments of the invention may be practiced without some or all of these specific details. It is understood that the terminology used herein is for the purpose of describing particular embodiments only, and is not intended to limit the scope of the invention. In the drawings, like reference numerals refer to same or similar functionalities or features throughout the several views.

It should be understood that the terms "comprising," "including," and "having" are intended to be open-ended and mean that there may be additional elements other than the listed elements. Use of identifiers such as first, second, third and fourth should not be construed in a manner imposing any relative position or time sequence between limitations. Furthermore, terms such as "top", "bottom", "side", "under", "vertical" used herein are merely for ease of description and refer to the orientation of the components as shown in the figures. It should be understood that any orientation of the components described herein is within the scope of the invention.

Figure 2C:
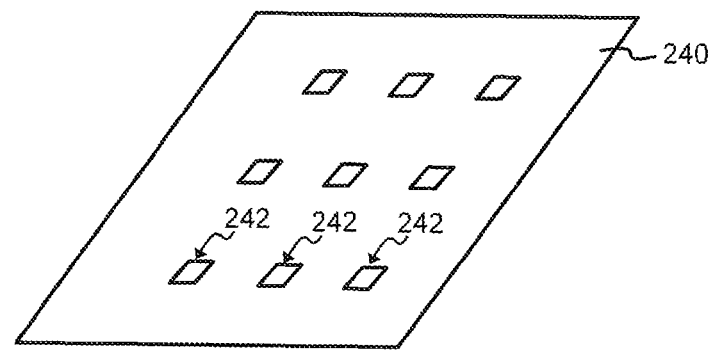
FIGS. 2A to 2C show a first substrate, a flexible film and a second substrate, respectively, according one embodiment of the invention.
Figure 2B:
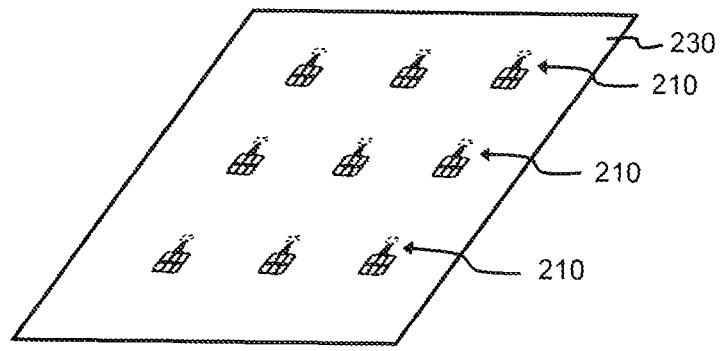
Figure 2A:
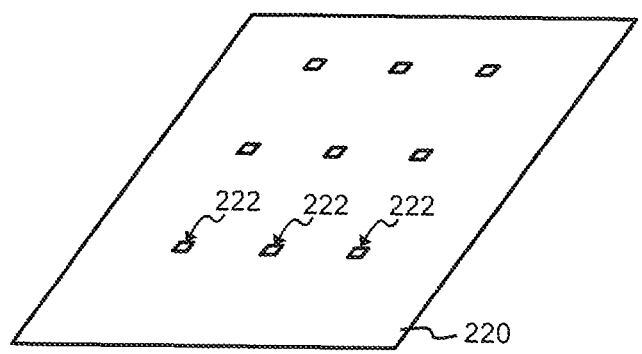

Reference is made to FIGS. 2A to 2J and FIG. 4. According to one embodiment of the invention, a method for fabricating a smart card device 200 of contact type interface includes the following steps:

In block 401, a flexible film 230 or sheet inlay, having at least one conductor or circuit pattern 210, is provided. FIG. 2B is a schematic representation of a flexible film 230 or sheet inlay having multiple conductor patterns 210.

The flexible film 230 is non-metallic and may be made of plastic, e.g. polyethylene terephthalate (PET). The flexible film 230 may be transparent.

Each conductor or circuit pattern 210 includes at least one flip chip 250 arranged on (e.g. bonded to) a bottom surface of the flexible film 230 and disposed at a position in a first vertical plane.

Each conductor pattern 210 further includes a metallic contact pad 260 arranged on a top surface of the flexible film 230 and disposed at a position in a 30 second vertical plane. The second vertical plane is non-overlapping with the first vertical plane. Accordingly, the flip chip is not disposed directly under the contact pad 260. Each contact pad 260 provides electrical conductivity when the smart card device is inserted into a smart card reader, e.g. computer, point of sale terminal. Physical and electrical characteristics of the contact pad 260 may be defined according to ISO 7816, in particular ISO 7816-2.

Each conductor pattern 210 further includes conductor paths 270 provided on the top and/or the bottom surface of the film 230 to provide electrical connection to and from the flip chip 250, contact pad 260, and/or any other components. The conductor paths 270 include at least one conductor path traversing a thickness of the flexible film 230 to electrically couple the contact pad 260 to the flip chip 250. Such conductor path may be embedded in the flexible film 230 by techniques such as but not limited to piercing through hole or mechanical riveting techniques to provide electrical coupling between the contact pad 260 and the flip chip 250.

Figure 2D:
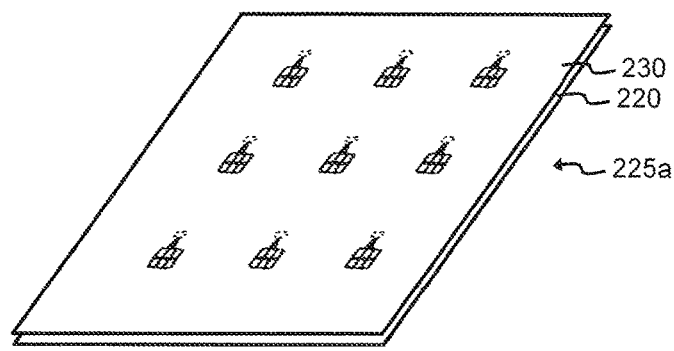
FIG. 2D shows overlaying the flexible film of FIG. 2B on the first substrate of FIG. 2A to produce a temporary core.
Figure 2H:
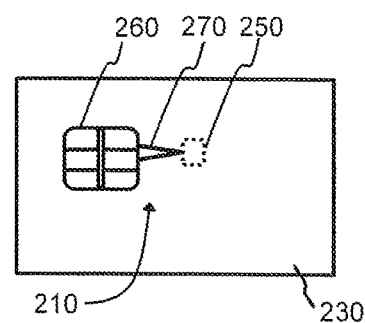
FIG. 2H is a partial close-up view of the flexible film of FIG. 2B and shows one conductor pattern in which a contact pad and conductor paths are arranged on a top surface of the film and a flip chip is arranged at a bottom surface of the film.
Figure 2E:
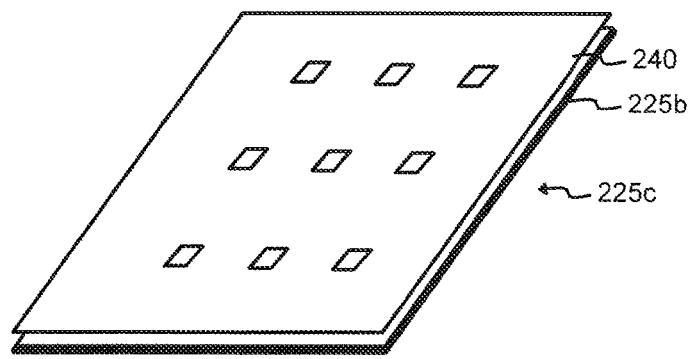
FIG. 2E shows overlaying of the second substrate of FIG. 2C on a laminated temporary core to produce a carrier core.

FIG. 2H is a partial close-up view of the flexible film of FIG. 2B wherein the contact pad 260 and certain conductor paths 270 are arranged on a top surface of the film 230 while a flip chip 250 is arranged on a bottom surface of the film 230.

Figure 2I:
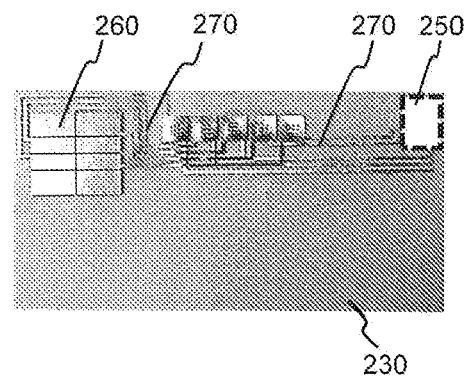
FIG. 2I shows another example of a flexible film having one conductor pattern in which a contact pad and conductor paths are arranged on a top surface of the film while a flip chip module is arranged at a bottom surface of the film.

FIG. 2I shows one example of a conductor pattern 210 provided on a flexible film 230 wherein the contact pad 260 and certain conductor paths 270 are arranged on a top surface of the film 230 while a flip chip 250 is arranged on a bottom surface of the film 230.

It is to be appreciated that the contact pads and conductor paths are formed or built on the flexible film 230 by known methods, e.g. dry etching.

In block 403, the flexible film 230 is overlaid or stacked on a first substrate 220 to produce a temporary core 225a.

This step includes applying an adhesive to one or both of the first substrate 220 and flexible film 230, and abutting the bottom surface of the flexible film 230 and the at least one flip chip 250 to the first substrate 220 (see FIG. 2D).

In one embodiment, the first substrate 220 (see FIG. 2A) is provided with at least one cavity 222 which is arranged to align with and at least partially receive the at least one flip chip when the flexible film 230 is laid or stacked upon the first substrate 220. The cavity 222 has at least one dimensional measurement which is no greater than at least one dimensional measurement of the at least one flip chip 250 such that the at least one cavity 222 of the first substrate 220 is dimensioned to at least partially receive the at least one flip chip 250 therein. The at least one dimensional measurement is selected from the group consisting of height, length and width of the respective cavity 222 or flip chip 250.

In another embodiment, the first substrate 220 (not shown) is devoid of cavity.

In block 405, the temporary core 225a is subject to a first lamination cycle to produce a laminated temporary core 225b in which the at least one flip chip 250 is embedded into and encapsulated by the first substrate 220.

Particularly, the temporary core 225a is placed or interposed between laminator plates. This arrangement comprising of laminator plates together with the interposed temporary core 225a is fed into a lamination machine where the temporary core 225a is subject to a first hot cycle for a period of time, e.g. about 30 minutes. The first hot cycle includes subjecting the temporary core 225a to high temperature, e.g. at least 80° C., and applying pressure, e.g. at least 20 bars or 20×10$^5$ pascal (Pa), to the temporary core 225a. Subsequently, the temporary core 225a is subject to a first cold cycle for a period of time, e.g. about 20 minutes. The first cold cycle includes subjecting the temporary core 225a to low temperature, e.g. no more than 30° C. and applying pressure, e.g. at least 20 bars or 20×10$^5$ pascal (Pa), to the temporary core 225a. It is to be appreciated that the time duration, temperature conditions, and pressure conditions may be modified, as known to persons skilled in the art, according to materials and equipment being used.

Due to pressure and temperature conditions during the first hot cycle, the first substrate 220 is softened and the flip chip(s) 250 are pressed or embedded into the softened first substrate 220. During the first cold cycle, the temporary core 225a is cooled and hardened. After completing the first cold cycle, a laminated temporary core 225b is produced in which the at least one flip chip 250 is embedded in the first substrate 220 such that the first substrate 220 provides an encapsulation to the at least one flip chip 250.

In block 407, a second substrate 240 is overlaid or stacked on the laminated temporary core 225b to produce a carrier core 225c. This step includes applying an adhesive to one or both of the second substrate 240 and flexible film 230, abutting the top surface of the film 230 to the second substrate 240 and exposing the at least one contact pad 260 through at least one cavity 242 in the second substrate 240. The second substrate 240 (see FIG. 2C) is provided with at least one cavity 242 which is dimensioned to at least accommodate the contact pad 260 therein.

In one embodiment, a thickness of the first substrate 220 is greater than a thickness of the second substrate 240.

In another embodiment, a thickness of the first substrate 220 is substantially the same as a thickness of the second substrate 240.

In block 409, the carrier core 225c is subject to a second lamination cycle to produce a laminated carrier core 225d (see FIG. 2F) in which the at least one contact pad 260 is projected through the at least one cavity 242 in the second substrate 240 to form a continuous even plane from an outer surface of the laminated carrier core 225d to the at least one contact pad 260.

Particularly, the carrier core 225c is placed or interposed between laminator plates. This arrangement comprising of laminator plates together with the interposed carrier core 225c is fed into a lamination machine where the carrier core 225c is subject to a second hot cycle for a period of time, e.g. about 30 minutes. The second hot cycle includes subjecting the carrier core 225c to high temperature, e.g. at least 80° C., and applying pressure, e.g. at least 20 bars or 20×10$^5$ pascal (Pa), to the carrier core 225c. Subsequently, the carrier core 225c is subject to a second cold cycle for a period of time, e.g. about 20 minutes. The second cold cycle includes subjecting the carrier core 225c to low temperature, e.g. no more than 30° C., and applying pressure e.g. at least 20 bars or 20×10$^5$ pascal (Pa), to the carrier core 225c. During the second cold cycle, the carrier core 225c is cooled and hardened. After completing the second cold cycle, a laminated carrier core 225d is produced. It is to be appreciated that the time duration, temperature conditions, and pressure conditions may be modified, as known to persons skilled in the art, according to materials and equipment being used.

Due to pressure and temperature conditions during the second hot cycle and the presence of each cavity 242 accommodating each contact pad 260, each contact pad 260 and, in some embodiments, a portion of the flexible film 230 surrounding the contact pad 260 are urged into and through the space of the cavity 242. Further projection of the contact pad 260 and any surrounding portion of the film 230 through the cavity 242 are constrained by the laminator plates and, accordingly, in the laminated carrier core 225d, a continuous even plane from an outer surface of the laminated carrier core 225d to the at least one contact pad 260 is achieved. In other words, no groove or gap will be observed in the area around contact pad 260. The result is an aesthetically pleasing and continuously even surface on the side of the laminated carrier core 225d where the contact pad 260 is visible and located.

Figure 2F:
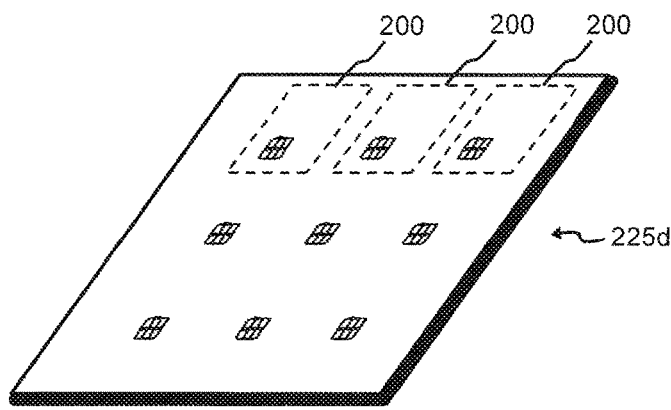
FIG. 2F shows a laminated carrier core prior to cutting into individual sections.
Figure 2J:
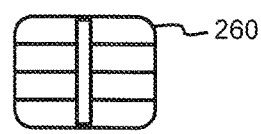
FIG. 2J shows one example of a contact pad.

In block 411, the laminated carrier core 225d is cut or diced into individual sections. A schematic representation of the dimensions of an individual section 200 is illustrated in FIG. 2F.

In one embodiment, each individual section 200 is dimensioned for credit card or bank card applications, e.g. ID-1 size according to ISO 7810, and at least includes the least one flip chip 250, contact pad 260 and conductor paths. Accordingly, each section is capable of being provided as a smart card device. It is to be appreciated that each section may take on other dimensions for other applications, e.g. USB token.

In the above-described method, the first and the second vertical plane are non-overlapping with a third vertical plane wherein an embossing area, which is designated on the ID-1 size laminated carrier core according to ISO 7811, particularly ISO 7811-3, is arranged at a position in the third vertical plane.

It is to be appreciated that although the foregoing paragraphs and FIGS. 2B, 2D, 2G, 2H, 2I, 3B, 3D, 3F, 3H, 3I describe a conductor pattern 210 in which the flip chip 250 and the contact pad 260 are arranged on opposite sides of the flexible film 230, it is to be appreciated that certain other embodiments can employ conductor patterns in which the flip chip and the contact pad are arranged on the same side of the flexible film, e.g. on the top surface of the film.

According to one embodiment of the invention, a method for fabricating a smart card device 200 of dual interface type, i.e. contact and contactless interfaces, is provided as described according to blocks 401 to 411 with appropriate modifications including but not limited to the following. For example, in block 401, at least one antenna coil 280 is provided or formed, e.g. by dry etching, on the top surface or the bottom surface of the film 230 and at a position in a fourth vertical plane, and wherein the fourth vertical plane is non-overlapping with the first and the second vertical plane, and wherein the at least one antenna coil 280 is electrically coupled to the at least one flip chip 250 by one or more conductor paths 270. Further, each conductor pattern may include two flip chips for respectively operating the contact and contactless interfaces of the smart card device. It is to be appreciated that the antenna coil may take the dimensions of slightly smaller than ID-1 size, half ID-1 size, quarter ID-1 size or other suitable dimensions.

Figure 5:
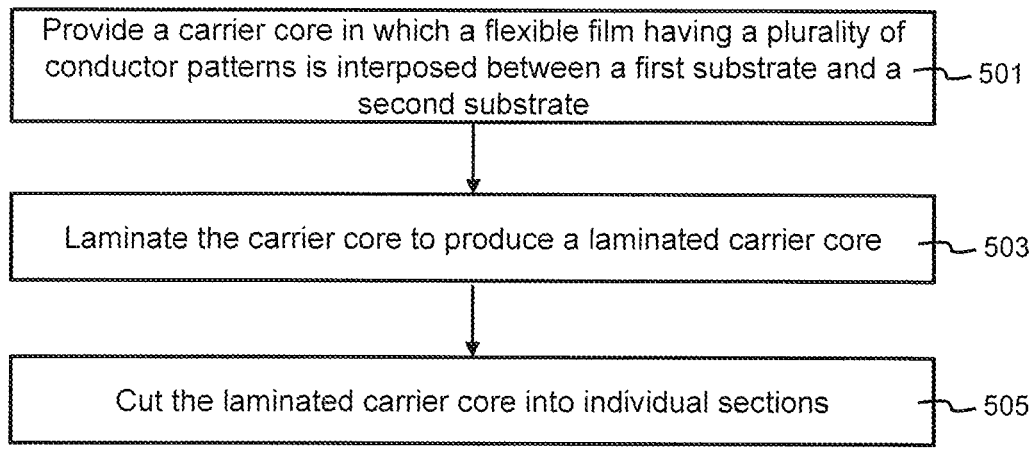
FIG. 5 shows a flow chart for a method for fabricating a smart card device according to one embodiment of the invention.

Reference is made to FIG. 5 illustrating a method for fabricating a smart card device 200 of contact type interface or dual interface (e.g. contact and contactless interfaces) according to one embodiment of the invention. As the features and characteristics of flexible film, conductor pattern, first substrate and second substrate would be similar to the foregoing description in relation to FIG. 4, their details will not be reproduced here.

In block 501, a carrier core is provided, in which a flexible film having a plurality of conductor patterns is interposed between a first substrate and a second substrate. This step includes applying an adhesive to one or both of the first substrate and flexible film, abutting the bottom surface of the flexible film and the at least one flip chip to the first substrate, applying an adhesive to one or both of the second substrate and flexible film, abutting the top surface of the flexible film to the second substrate, and exposing the at least one contact pad through at least one cavity in the second substrate. It is to be appreciated that some of the above steps within block 501 may be interchanged.

In certain other embodiments which employ conductor patterns in which the flip chip and the contact pad are arranged on the same side of the flexible film, e.g. on the top surface of the film, the at least one flip chip would not be abutted to the first substrate.

In block 503, the carrier core is laminated to produce a laminated carrier core.

Particularly, the carrier core is placed or interposed between laminator plates. This arrangement comprising of laminator plates together with the interposed carrier core is fed into a lamination machine where the carrier core is subject to a hot cycle for a time period, e.g. about 30 minutes. The hot cycle includes subjecting the carrier core to high temperature, e.g. at least 80° C., and applying pressure, e.g. at least 20 bars or $20 \times 10^5$ pascal (Pa), to the carrier core. Subsequently, the core is subject to a cold cycle for a period of time, e.g. about 20 minutes. The cold cycle includes subjecting the carrier core to low temperature, e.g. no more than 30° C., and applying pressure, e.g. at least 20 bars or $20 \times 10^5$ pascal (Pa), to the carrier core. It is to be appreciated that the time duration, temperature conditions, and pressure conditions may be modified, as known to persons skilled in the art, according to materials and equipment being used.

Due to pressure and temperature conditions during the hot cycle, the first substrate is softened and the flip chip(s) are pressed or embedded into the softened first substrate. At the same time, due to presence of a cavity accommodating each contact pad, each contact pad and, in some embodiments, a portion of the flexible film surrounding the contact pad would be urged into and through the space of the cavity. Further projection of the contact pad and any surrounding portion of the film through the cavity are constrained by the laminator plates and, accordingly, in the laminated carrier core, a continuous even plane from an outer surface of the laminated carrier core to the at least one contact pad is achieved. In other words, no groove or gap will be observed in the area around contact pad. The result is an aesthetically pleasing and continuously even surface on the side of the laminated carrier core where the contact pad is visible and located; and an encapsulation provided by the first or the second substrate to the flip chip.

Figure 2G:
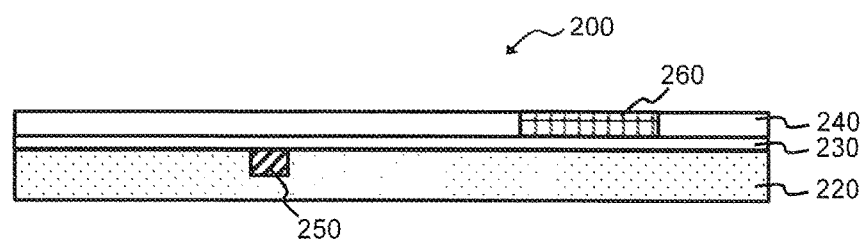
FIG. 2G shows a cross-sectional view of a smart card device which is obtained from a cut section of the laminated carrier core of FIG. 2F.

In block 505, the laminated carrier core is cut or diced into individual sections of ID-1 or other sizes. Reference is made to FIG. 2G which is a cross-sectional view of an IC-embedded device or smart card device 200 cut out from the laminated carrier core 225d and corresponds to the individual section 200 referred to in block 411.

FIG. 2G shows a flip chip 250 embedded in a laminated carrier core which includes a flexible film 230 having a conductor pattern and interposed between a first substrate 220 and a second substrate 240.

The flexible film 230 includes a conductor pattern 210 provided on a top and/or a bottom surface of the film 230. The conductor pattern 210 includes at least one flip chip 250 embedded in the first substrate 220, and arranged on a bottom surface of the film 230 and at a position in a first vertical plane. The conductor pattern 210 further includes a metallic contact pad 260 arranged on a top surface of the film 230 abutting the second substrate 240 and at a position in a second vertical plane. The conductor pattern 210 further includes conductor paths 270 electrically coupling the contact pad 260 to the flip chip 250. In some embodiments, at least one conductor path traverses a thickness of the film 230 to electrically couple the contact pad 260 to the at least one flip chip 250. The first vertical plane is non-overlapping with the second vertical plane. The at least one flip chip module 250 is embedded into the first substrate 220 such that the second substrate 240 encapsulates the at least one flip chip module. The at least one contact pad 260 is projected through the at least one cavity in the second substrate 240 to form a continuous even plane from an outer surface of the laminated carrier core to the at least one contact pad 260.

The first substrate 220 includes a top or inner surface laminated to a bottom surface of the film 230 including the at least one flip chip 250. The at least one flip chip module is embedded in the first substrate 220 such that the entire body of the second substrate 240 provides an encapsulation to the flip chip module. This encapsulation provides an area and volume which are greater than flip-chip embedded device and protect the flip chip from breakage.

The second substrate 240 has a cavity through which the contact pad 260 and, in certain embodiments, a portion of the flexible film 230 surrounding the contact pad 260, are projected for implementing contact-type transactions. The second substrate 240 includes a bottom or inner surface laminated to a top surface of the film 230 and a top or outer surface which forms a continuous even plane from an outer surface of the laminated carrier core to the at least one contact pad 260. A region between the contact pad 260 and the surrounding outer surface of the laminated core or second substrate 240 is devoid of groove or gap which is otherwise present in existing smart cards fabricated by aforementioned existing methods.

In one embodiment, a thickness of the first substrate 220 is greater than a thickness of the second substrate 240. In another embodiment, a thickness of the first substrate 220 is substantially the same as a thickness of the second substrate 240.

In one embodiment, the laminated carrier core is dimensioned according to ID-1 size according to ISO 7810.

In one embodiment, the contact pad 260 is dimensioned according to ISO 7816.

In one embodiment, an embossing area, which is designated on the laminated carrier core according to ISO 7811, particularly ISO 7811-3, is arranged at a position in a third vertical plane, wherein the third vertical plane is non-overlapping with the first and the second vertical plane. The embossing area is configured to be embossed with information, e.g. identification number, name and address. Other types of information may also be embossed.

Figure 3C:
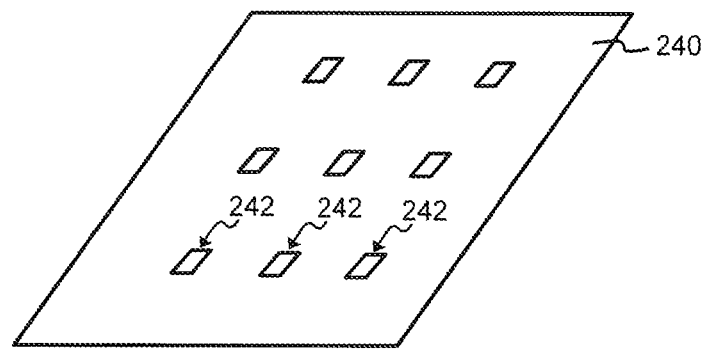
FIGS. 3A to 3C show a first substrate, a flexible film with antenna coils and a second substrate, respectively, according one embodiment of the invention.
Figure 3B:
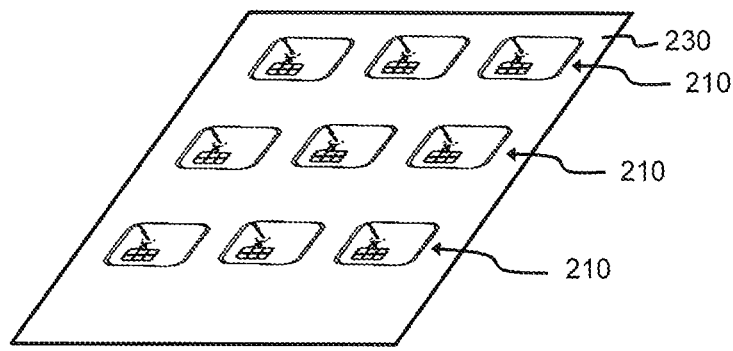
Figure 3A:
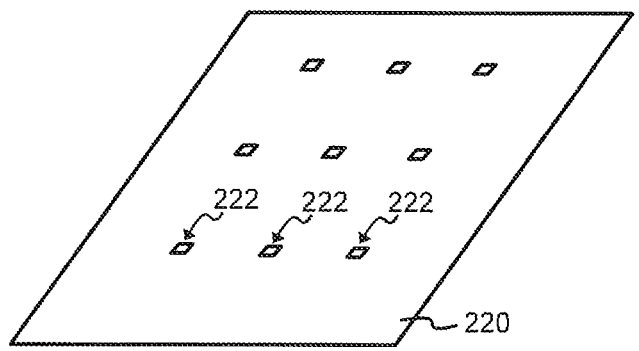
Figure 3D:
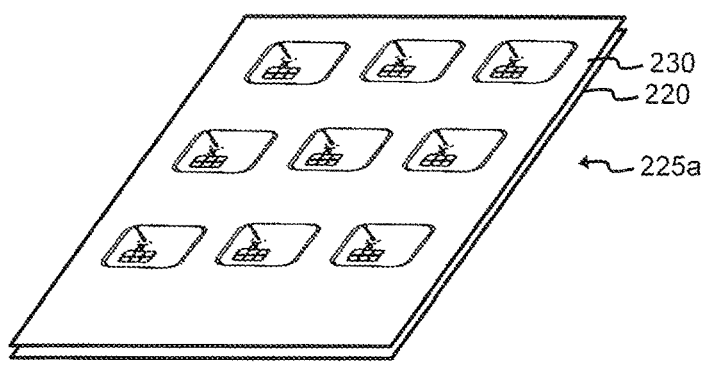
FIG. 3D shows overlaying the flexible film of FIG. 3B on the first substrate of FIG. 3A to produce a temporary core.
Figure 3H:
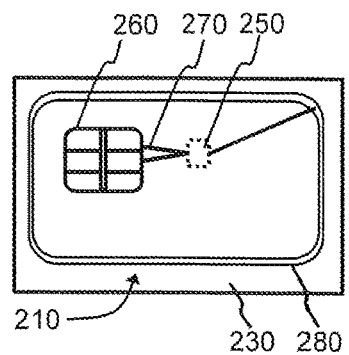
FIG. 3H is a partial close-up view of the flexible film of FIG. 3B and shows one conductor pattern in which a contact pad, conductor paths and antenna coil are arranged on a top surface of the film, while a flip chip is arranged at a bottom surface of the film.
Figure 3E:
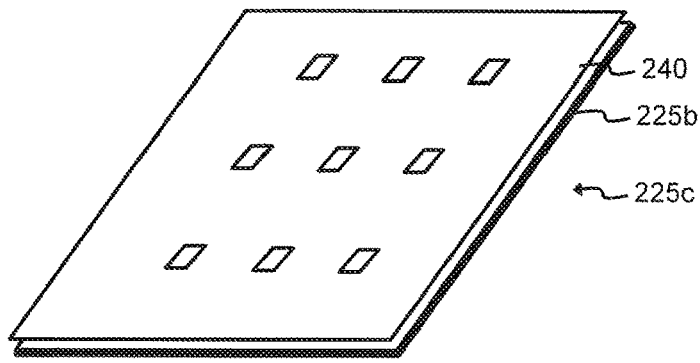
FIG. 3E shows overlaying of the second substrate of FIG. 3A a laminated temporary core to produce a carrier core.
Figure 3I:
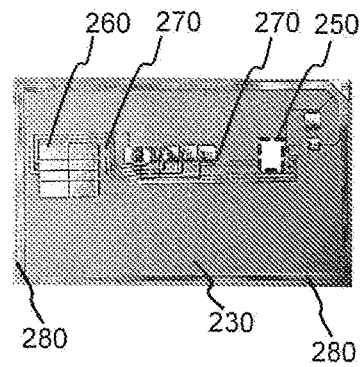
FIG. 3I shows another example of a flexible film having one conductor pattern in which a contact pad, conductor paths and an antenna coil are arranged on a top surface of the film, while a flip chip is arranged at a bottom surface of the film.
Figure 3F:
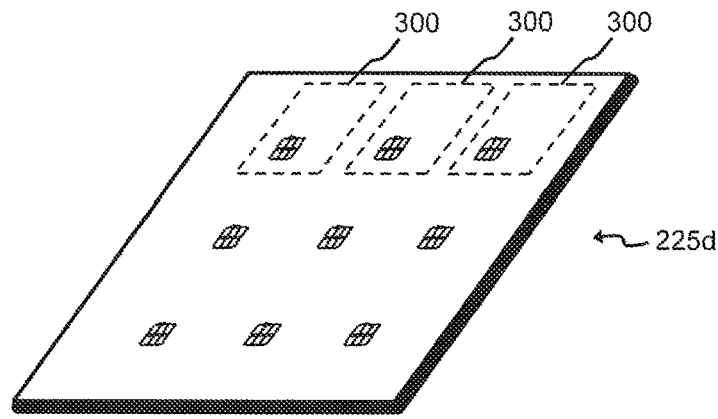
FIG. 3F shows a laminated carrier core prior to cutting into individual sections.
Figure 3G:
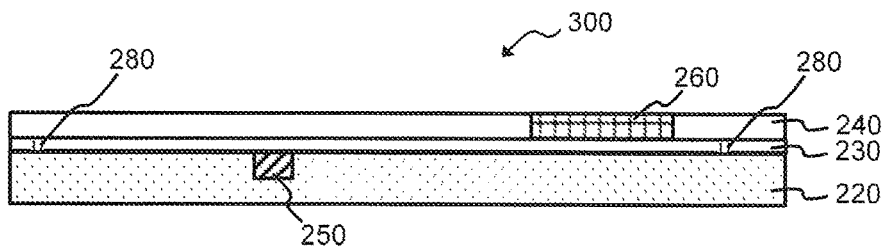
FIG. 3G shows a cross-sectional view of a smart card device which is obtained from a cut section of the laminated carrier core of FIG. 3F.
Figure 4:
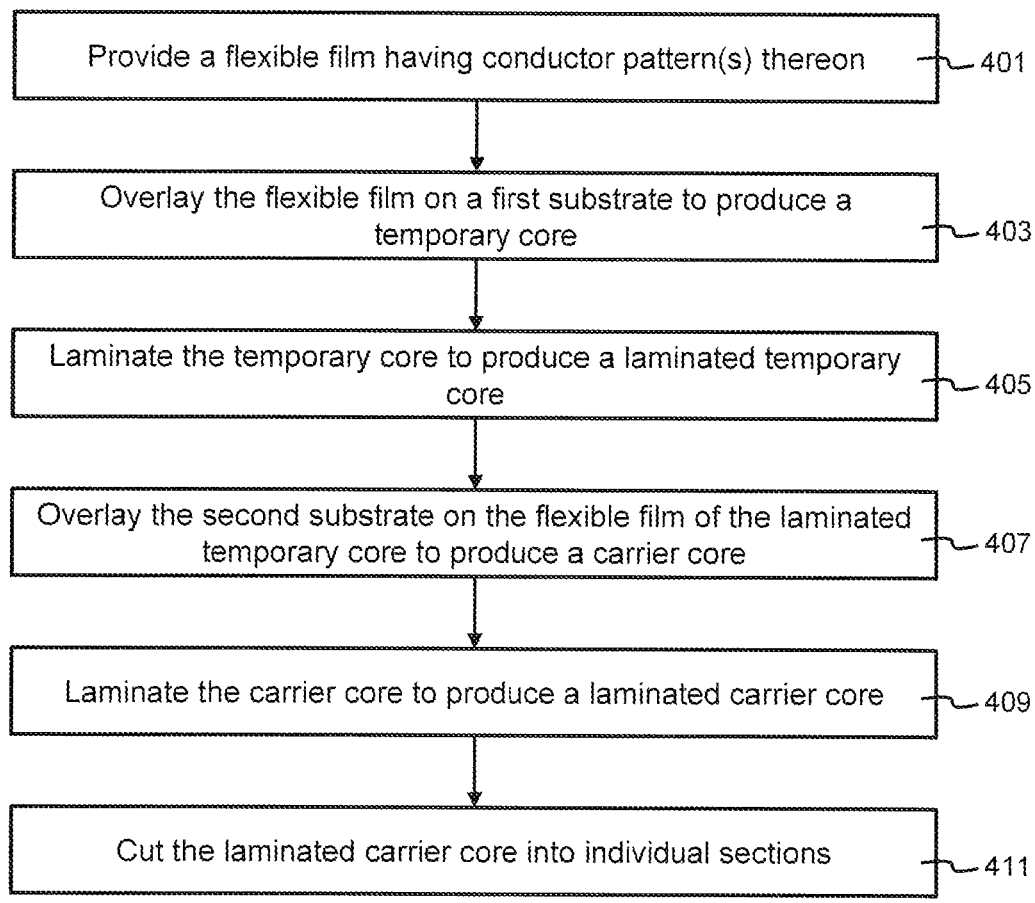
FIG. 4 shows a flow chart for a method for fabricating a smart device according to one embodiment of the invention.

Reference is made to FIG. 3G which is a cross-sectional view of an IC-embedded device or smart card device 300 having dual interface i.e. contact and contactless interfaces. The smart card device 300 of FIG. 3G is similar to FIG. 2G except that the film 230 further includes at least one antenna coil 280 provided on the top or bottom surface of the film 230 and is electrically coupled to the at least one flip chip 250. The at least one antenna coil 280 is provided at a position in a fourth vertical plane, wherein the fourth vertical plane is non-overlapping with the first and the second vertical plane.

Figure 6:
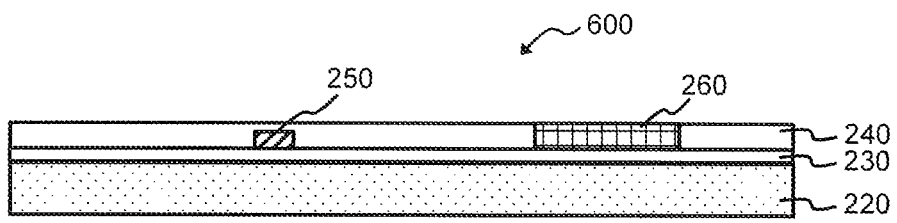
FIG. 6 shows a cross-sectional view of a smart card device in which the flip chip and the contact pad are arranged on the same side of the flexible film.

FIG. 6 is a cross-sectional view of an IC-embedded device or smart card device 600 in which the flip chip 250 and contact pad 260 are arranged on the same side, e.g. top surface, of the flexible film 230. Accordingly, in this embodiment, the at least one flip chip 250 is embedded into and encapsulated by the second substrate 240. Other details of the smart card device 600 are similar to FIG. 2G and therefore will not be reproduced here.

Embodiments of the invention provide several advantages including but not limited to the following:

In existing methods described above, an antenna coil which is unconnected to any integrated chip module is interposed between two substrates with equal thickness before milling is performed to expose portions of the antenna coil. Subsequently, one of various methods is used to electrically connect the exposed portions of the antenna coil to the integrated circuit module.

In contrast, with the invention, a single layer (e.g. a film or substrate which is preferably flexible and non-metallic) having a conductor pattern comprising at least one flip chip, conductor paths and at least one antenna coil is used. The use of this single sheet inlay with conductor patterns eliminates the steps for milling the laminated substrate to expose portions of the antenna coil and connecting the exposed portions of the antenna coil to the flip chip. The use of this single sheet inlay with conductor patterns also improves the reliability of the connection to the antenna coil, as the contact pad and conductor paths including conductor path connecting the flip chip to antenna coil are laminated onto the film within a same process.

In the existing methods described above, the flip chip is located directly on underside of the contact pad (see FIG. 1B) and therefore the flip chip is prone to damage due to repeated use from interfacing the contact pad with a contact-type reader.

In contrast, with the invention, the offset arrangement or vertical dis-alignment of the flip chip relative to contact pad reduces the risk of damage to the chip even with repeated use from interfacing the contact pad with a contact-type reader.

In various embodiments of the invention for fabricating smart card devices of ID-1 size, the IC module may be positioned on anywhere within the ID-1 dimensions other than in the vertical planes for positioning the contact pad, embossing information, and positioning the antenna coil (for dual interface cards). Accordingly, the lifespan and reliability of the IC-embedded device or smart card device of the invention would be improved.

In the existing methods described above, the IC chip 150 is provided with an encapsulation 152 having an area and volume which are a fraction of the smart card device 100 or contact pad 160 of the smart card module 110.

In contrast, with the invention, the flip chip 250 is embedded in the first substrate 220 or second substrate 240 and thus is provided with an encapsulation (i.e. first substrate) having an area and volume significantly greater than the contact pad 260 and flip chip 250. Consequently, if a force of same magnitude is separately applied to an existing smart card device 100 of FIG. 1B and a smart card device 200, 300, 600 of FIGS. 2G, 3G and 6 according to the invention, the existing smart card device (FIG. 1B) would be subject to greater pressure per unit area due to smaller encapsulation area and is therefore more likely to break, whereas the smart card device of the invention (FIGS. 2G, 3G and 6) would be subject to lesser pressure per unit area due to larger encapsulation area and is therefore less likely to break. Accordingly, the larger encapsulation area and volume of the smart card device of the invention (FIGS. 2G, 3G and 6) provide greater protection to the flip chip and therefore improves the lifespan and reliability of the smart device 200, 300, 600.

Figure 1B:
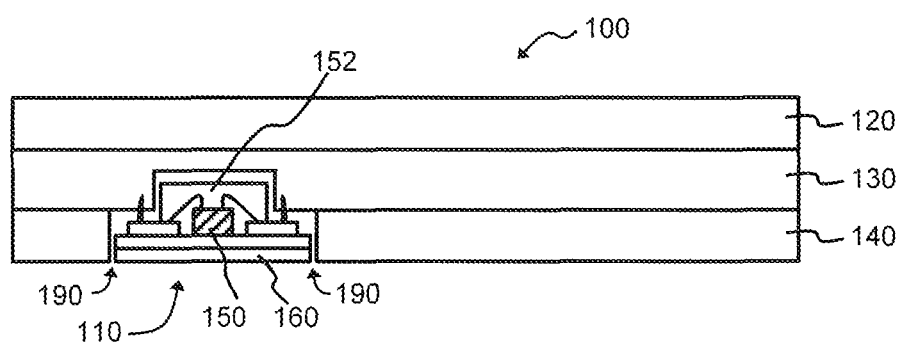
FIG. 1B shows a cross-sectional view of a prior art smart card device.

In existing smart card device 100 of FIG. 1B, there are gaps 190 between the contact pad 160 and the surrounding substrate 140 of the carrier core. These gaps often, while narrow, often accumulate dirt and grime.

In contrast, with the invention, the contact pad 260 and, in certain embodiments, a portion of the surrounding film is projected through a cavity during lamination and to provide a continuous even plane from an outer surface of the carrier core to the at least one contact pad with no groove or gap between the contact pad and carrier core.

It is to be understood that the embodiments and features described above should be considered exemplary and not restrictive. Many other embodiments will be apparent to those skilled in the art from consideration of the specification and practice of the invention. Furthermore, certain terminology has been used for the purposes of descriptive clarity, and not to limit the disclosed embodiments of the invention.

The invention claimed is:

1. A smart card device comprising:
   a laminated carrier core comprising:
      a first substrate;
      a second substrate; and
      a flexible film having a conductor pattern and interposed between the first and the second substrate, characterised in that the conductor pattern includes:
         at least one flip chip embedded into the first or the second substrate,
         a contact pad arranged offset relative to the at least one flip chip,
         at least one conductor path electrically coupling the contact pad to the at least one flip chip, wherein the at least one conductor path and the contact pad are formed on the flexible film and wherein the contact pad is projected through a cavity in the second substrate to form a continuous even plane from an outer surface of the laminated carrier core to the contact pad such that a region between the contact pad and the outer surface of the laminated carrier core is devoid of gap.

2. The smart card device of claim 1, wherein the laminated carrier core is dimensioned as 85.60 mm×53.98 mm.

3. The smart card device of claim 2, wherein the contact pad is dimensioned to include at least a first contact location, a second contact location, a third contact location, a fifth contact location, a sixth contact location, a seventh location wherein the first contact location is within 19.23 mm to 20.93 mm from an upper edge of the laminated carrier core and within 10.25 mm and 12.25 mm from a left edge of the laminated carrier core, which is adjacent to the upper edge, the second contact location is within 21.77 mm to 23.47 mm from the upper edge and within 10.25 mm to 12.25 mm from the left edge, the third contact location is within 24.31 mm to 26.01 mm from the upper edge and within 10.25 mm to 12.25 mm from the left edge, the fifth contact location is within 19.23 mm to 20.93 mm from the upper edge and within 17.87 mm to 19.87 mm from the left edge, the sixth contact location is within 21.77 mm to 23.47 mm from the upper edge and within 17.87 mm to 19.87 mm from the left edge, the seventh contact location is within 24.31 mm to 26.01 mm from the upper edge and within 17.87 mm to 19.87 mm from the left edge, and wherein the contact pad is dimensioned to optionally include a fourth contact location within 26.85 mm to 28.55 mm from the upper edge and within 10.25 mm to 12.25 mm from the left edge, an eighth contact location within 26.85 mm to 28.55 mm from the upper edge and within 17.87 mm to 19.87 mm from the left edge.

4. The smart card device of claim 3, wherein the outer surface of the laminated core includes an embossing area which is designated on the laminated carrier core and has a width of 85.47 to 85.90 mm and a height of 24.03 mm.

5. The smart card device of claim 4, wherein the embossing area is configured to be embossed with information being at least one selected from the group consisting of identification number, name and address.

6. The smart card device of claim 5, wherein the conductor pattern further includes at least one antenna coil electrically coupled to the at least one flip chip, wherein the at least one antenna coil is formed on the flexible film.

7. The smart card device of claim 1, wherein the at least one flip chip and the contact pad are arranged on opposite sides of the flexible film.

8. The smart card device of claim 7, wherein the conductor pattern further includes at least one antenna coil electrically coupled to the at least one flip chip, wherein the at least one antenna coil is formed on the flexible film.

9. The smart card device of claim 1, wherein the at least one flip chip and the contact pad are arranged on same side of the flexible film.

10. The smart card device of claim 9, wherein the conductor pattern further includes at least one antenna coil electrically coupled to the at least one flip chip, wherein the at least one antenna coil is formed on the flexible film.

11. The smart card device of claim 1, wherein the conductor pattern further includes at least one antenna coil electrically coupled to the at least one flip chip, wherein the at least one antenna coil is formed on the flexible film.

12. The smart card device of claim 11, wherein the first or the second substrate provides an encapsulation to the at least one flip chip, the encapsulation having an area and a volume which are greater than the contact pad.

13. The smart card device of claim 1, wherein the first or the second substrate provides an encapsulation to the at least one flip chip, the encapsulation having an area and a volume which are greater than the contact pad.

14. The smart card device of claim 2, wherein the conductor pattern further includes at least one antenna coil electrically coupled to the at least one flip chip, wherein the at least one antenna coil is formed on the flexible film.

15. The smart card device of claim 3, wherein the conductor pattern further includes at least one antenna coil electrically coupled to the at least one flip chip, wherein the at least one antenna coil is formed on the flexible film.

16. The smart card device of claim 4, wherein the conductor pattern further includes at least one antenna coil electrically coupled to the at least one flip chip, wherein the at least one antenna coil is formed on the flexible film.

17. The smart card device of claim 2, wherein the first or the second substrate provides an encapsulation to the at least one flip chip, the encapsulation having an area and a volume which are greater than the contact pad.

18. The smart card device of claim 3, wherein the first or the second substrate provides an encapsulation to the at least one flip chip, the encapsulation having an area and a volume which are greater than the contact pad.

19. The smart card device of claim 4, wherein the first or the second substrate provides an encapsulation to the at least one flip chip, the encapsulation having an area and a volume which are greater than the contact pad.

20. The smart card device of claim 5, wherein the first or the second substrate provides an encapsulation to the at least one flip chip, the encapsulation having an area and a volume which are greater than the contact pad.

21. The smart card device of claim 7, wherein the first or the second substrate provides an encapsulation to the at least one flip chip, the encapsulation having an area and a volume which are greater than the contact pad.

22. The smart card device of claim 9, wherein the first or the second substrate provides an encapsulation to the at least one flip chip, the encapsulation having an area and a volume which are greater than the contact pad.

* * * * *